United States Patent [19]
Ikada

[11] Patent Number: 5,864,262
[45] Date of Patent: Jan. 26, 1999

[54] SURFACE ACOUSTIC WAVE DEVICE HAVING ONE-PORT AND DOUBLE MODE SAW RESONATORS

[75] Inventor: Katsuhiro Ikada, Kanazawa, Japan

[73] Assignee: Murata Manufacturing Co. Ltd., Kyoto, Japan

[21] Appl. No.: 686,322

[22] Filed: Jul. 25, 1996

[30]     Foreign Application Priority Data

Jul. 25, 1995  [JP]  Japan .................................. 7-188790

[51] Int. Cl.⁶ .................................................. H03H 9/64
[52] U.S. Cl. ........................ 333/193; 333/195; 310/313 B
[58] Field of Search ..................................... 333/193–196; 310/313 R, 313 B, 313 C, 313 D

[56]            References Cited

U.S. PATENT DOCUMENTS 4,803,449  2/1989  Hikita et al. ............................. 333/193

FOREIGN PATENT DOCUMENTS

| 0569977 | 11/1993 | European Pat. Off. . | |
| 0600705 | 6/1994 | European Pat. Off. . | |
| 0 633 659 A1 | 1/1995 | European Pat. Off. | ............... 333/195 |
| 0633660 | 1/1995 | European Pat. Off. . | |
| 2-305015 A | 12/1990 | Japan | ...................................... 333/194 |

OTHER PUBLICATIONS

Mitsutaka Hikita, "Miniature SAW Antenna Duplexer for 800–Mhz Portable Telephone Used in Cellular Radio Systems", IEEE Transactions on Microwave Theory and Techniques, vol. 36, No. 6, Jun. 1988, pp. 1047–1056.

*Primary Examiner*—Robert J. Pascal
*Assistant Examiner*—Barbara Summons
*Attorney, Agent, or Firm*—Ostrolenk, Faber, Gerb & Soffen, LLP

[57]            ABSTRACT

A surface acoustic wave device which not only is low-loss in a pass band and has high attenuation in an attenuation region but also has superior power-resistance and has a large reflection coefficient in a blocking region comprises a first one-port SAW resonator filter connected in parallel with a three-electrode vertically connected double mode SAW resonator filter. The first one-port SAW resonator filter is so constructed that its resonance frequency is outside the pass band of the vertically connected double mode SAW resonator filter on the low-frequency side thereof and a connection point between the double mode SAW resonator filter and the first one-port SAW resonator filter is provided to an input terminal.

16 Claims, 13 Drawing Sheets

SURFACE ACOUSTIC WAVE DEVICE HAVING ONE-PORT AND DOUBLE MODE SAW RESONATORS

BACKGROUND OF THE INVENTION

This invention relates to a surface acoustic wave device, and particularly to a surface acoustic wave device used as a band-pass filter and having a circuit construction comprising a plurality of surface acoustic wave (SAW) resonator filters connected in the form of a ladder.

High-frequency filters of mobile communication devices such as portable telephones in which SAW resonator filters are used have been proposed. As a surface acoustic wave device used in this kind of application, a surface acoustic wave device having the connection structure shown in FIG. 1 has been proposed.

In this surface acoustic wave device, a three-electrode vertically connected double mode SAW resonator filter 1 is disposed between an input terminal IN and an output terminal OUT. This vertically connected double mode SAW resonator filter 1 has three inter digital transducers (hereinafter referred to as IDTs) 2 to 4 arranged along a SAW propagation direction. Reflectors 5 and 6 are disposed at the surface wave propagation direction ends of the arrangement of IDTs 2 to 4.

One comb electrode 2a, 4a of each of the IDTs 2 and 4 among the IDTs 2 to 4 is connected to the input terminal IN by way of a first one-port SAW resonator filter 7. One comb electrode 3a of the IDT 3 is connected to the output terminal OUT. The other comb electrodes 2b, 3b and 4b of the IDTs 2 to 4 are connected to a ground potential.

Also, a second one-port SAW resonator filter 9 is connected between the ground potential and a connection point 8 between the comb electrode 3a and the output terminal OUT.

Accordingly, in the surface acoustic wave device shown in FIG. 1, a vertically connected double mode SAW resonator filter 1 is connected between input and output terminals and a first one-port SAW resonator filter 7 is connected in series with the input side of this vertically connected double mode SAW resonator filter 1. Also, a second one-port SAW resonator filter 9 is connected between a reference potential and a point between the input and output terminals. Thus, the surface acoustic wave device shown in FIG. 1 comprises a filter circuit having two series resonators and one parallel resonator.

Here, the resonance frequency of the first one-port SAW resonator filter 7 is within the pass band of the vertically connected double mode SAW resonator filter 1 and the antiresonance frequency of the second one-port SAW resonator filter 9 is within the pass band of the vertically connected double mode SAW resonator filter 1.

In the surface acoustic wave device described above, because the first one-port SAW resonator filter 7 is connected to the outer IDTs 2 and 4 of the vertically connected double mode SAW resonator filter 1 and also has the above-mentioned resonance characteristic, the VSWR in the outer IDTs 2 and 4 of the vertically connected double mode SAW resonator filter 1 is reduced and also the amount of attenuation outside the pass band and particularly in the blocking region on the high-frequency side is increased.

Also, because the second one-port SAW resonator filter 9 has the above-mentioned resonance characteristic, the VSWR in the central IDT 3 of the vertically connected double mode SAW resonator filter 1 is reduced and also the amount of attenuation outside the pass band and particularly in the blocking region on the low-frequency side is increased.

Therefore, it is possible to reduce losses in the pass band, reduce the VSWR in the pass band and increase the amount of attenuation in the blocking region.

However, when the surface acoustic wave device shown in FIG. 1 is used, for example, in an antenna of a portable telephone or the like, in the blocking region of the receiving side filter a large electrical power signal from the transmission side is impressed. Consequently, with the surface acoustic wave device construction described above, there has been a problem that when a large power of for example about 2 W is impressed on the device it instantaneously breaks down.

Also, when the surface acoustic wave device described above is used as a receiving side filter of an antenna of a portable telephone or the like, normally, the surface acoustic wave device is connected using a strip line or the like to a transmission side filter made using for example dielectric resonators or a surface acoustic wave device. That is, the surface acoustic wave device described above and a transmission side filter are connected using a strip line or the like so that the impedance in the blocking region is open.

However, in this case, to suppress transmission side losses, it is highly desirable that the reflection coefficient of the receiving side filter in the transmission side pass band be large. But when the surface acoustic wave device described above is used as the receiving side filter, the reflection coefficient thereof in the transmission side pass band has not always been sufficient.

SUMMARY OF THE INVENTION

Accordingly, it is an object of the invention to provide a surface acoustic wave device which not only is low-loss in the pass band and has high attenuation in the attenuation region but also has superior power-resistance and has a large reflection coefficient in the blocking region.

The invention is a surface acoustic wave device comprising a first one-port SAW resonator filter electrically connected in parallel with a three-electrode vertically connected double mode SAW resonator filter having reflectors, and is characterized by having the following construction: The first one-port SAW resonator filter has IDTs having a plurality of pairs of mutually intermeshing electrode fingers but does not have reflectors. Also, the resonance frequency of the first one-port SAW resonator filter is outside the pass band of the vertically connected double mode SAW resonator filter on the low-frequency side thereof and a connection point connecting the vertically connected double mode SAW resonator filter and the first one-port SAW resonator filter is made an input terminal.

In an alternative embodiment of the invention, the first one-port SAW resonator filter has IDTs having a plurality of pairs of mutually intermeshing electrode fingers and may have reflectors. The inventor has discovered that the invention may function even if the first one-port SAW resonator filter has reflectors.

In the invention, because as described above the resonance frequency of the first one-port SAW resonator filter is positioned on the low-frequency side of the pass band, i.e. in the low-frequency side blocking region, of the vertically connected double mode SAW resonator filter, and it is connected as described above, it is possible to increase the amount of attenuation outside the pass band, that is, in the low-frequency side blocking region. Furthermore, when the invention is used as a filter of an antenna of, for example, a portable telephone or the like, it is possible to increase the reflection coefficient in the blocking region. Also, because the first one-port SAW resonator filter is connected on the input side of the vertically connected double mode SAW resonator filter, impressed power is dispersed between the vertically connected double mode SAW resonator filter and the first one-port SAW resonator filter. As a result, the power-resistance can be increased.

Preferably, in a surface acoustic wave device of the invention, the vertically connected double mode SAW resonator filter is a three-electrode vertically connected double mode SAW resonator filter having three IDTs arranged along a surface wave propagation direction, the sum of the numbers of electrode fingers of the outer IDTs being greater than the number of electrode fingers of the central IDT and the first one-port SAW resonator filter being connected to the pair of outer IDTs of the vertically connected double mode SAW resonator filter.

With this construction, it is possible to further increase the power-resistance in the blocking region on the input side. That is, the reason why a surface acoustic wave device in a SAW filter breaks down when a large power is fed in is that migration occurs between the electrodes constituting the IDTs due to mechanical stress arising when the surface waves are excited. In the above-mentioned preferable construction of the invention, in the vertically connected double mode SAW resonator filter, because [1] power is impressed on the pair of outer IDTs and the sum of the numbers of electrode fingers of the outer IDTs is greater than the number of electrode fingers of the central IDT, and [2] the first one-port SAW resonator filter having a plurality of pairs of IDTs is disposed as a parallel arm on the input side, the total area of the electrodes on which the power is impressed is made large and the power-resistance on the input side is more greatly increased.

Also, according to another preferable aspect of the invention, the first one-port SAW resonator filter is made using a 36° Y-cut, X-propagation piezoelectric substrate and is made by connecting four or two SAW resonators in series and the ratio of the width w of the electrode fingers of the IDTs constituting the SAW resonators to the wavelength $\lambda_1$, of the SAW resonators satisfies the following expression:

$$w/\lambda_1 < \tfrac{1}{4} \qquad \ldots \text{Exp. (1)}$$

With this construction, because the first one-port SAW resonator filter has a 2-stage or 4-stage construction, it is possible to make the electrode area large and the power-resistance can thereby be increased. Also, when the first one-port SAW resonator filter is given a multi-stage construction, although a spurious response existing between the resonance frequency and the antiresonance frequency of the first one-port SAW resonator filter becomes larger, as is clear from preferred modes of practicing the invention which will be described later, because the SAW resonators constituting the first one-port SAW resonator filter are so constructed that they satisfy the above Exp. (1), the above-mentioned spurious response can be suppressed. In addition, by constructing the resonators of the one-port SAW resonator filter so that they satisfy the above Exp. (1), shorting across IDTs caused by migration between the electrode fingers of the IDTs when power is impressed is made less likely to occur. Also, because the first one-port SAW resonator filter is connected in parallel with the double mode SAW resonator filter, even if the width w of the electrode fingers is made small, the influence of this on the pass band is small. Therefore, it is possible to increase the power-resistance without bringing about loss deterioration in the resonance characteristic of the pass band.

According to another specific aspect of the invention, the first one-port SAW resonator filter is made using a 36° Y-cut, X-propagation piezoelectric substrate and is made by connecting four or two resonators in series and the ratio of the spacing t between the electrode fingers of the IDTs of the resonators to the wavelength $\lambda_1$ of the resonators is made $t/\lambda_1 > 3$.

With this construction, because the first one-port SAW resonator filter is given a 4-stage or 2-stage construction, it is possible to increase the power-resistance by increasing the electrode area. As mentioned above, when the first one-port SAW resonator filter is given a multi-stage construction, there is a danger that a spurious response existing between the resonance frequency and the antiresonance frequency of the first one-port SAW resonator filter will become large. However, with this construction, because $t/\lambda_1 > 3$, as is clear from preferred modes of practicing the invention which will be described later, it is possible to effectively suppress the spurious response in the pass band. Therefore, it is possible to further increase power-resistance without having any affect on the characteristics in the pass band.

According to a further aspect of the invention, the vertically connected double mode SAW resonator filter is made using a 36° Y-cut, X-propagation piezoelectric substrate and when the spacing between the centers of the outer end electrode fingers of the outer IDTs and the centers of the inner end electrodes of the reflectors is I, the ratio of I to the wavelength $\lambda_2$ of the reflectors satisfies the following expression:

$$0.53 \leq I/\lambda_2 \leq 0.59$$

With this construction, as is clear from preferred modes of practicing the invention which will be described later, because the spacing I between the outer IDTs of the vertically connected double mode SAW resonator filter and the reflectors is greater than $0.53\lambda_2$, it is possible to increase the reflection coefficient in the blocking region. Also, because the above-mentioned spacing I is less than $0.59\lambda_2$, the VSWR in the pass band can be made large. Therefore, it is possible to further increase the reflection coefficient in the blocking region without deteriorating the characteristics in the pass band.

According to still another aspect of the invention, a second one-port SAW resonator filter is connected in series with the central IDT of the above-mentioned three-electrode vertically connected double mode SAW resonator filter. This second one-port SAW resonator filter has its antiresonance frequency on the outside of the pass band of the vertically connected double mode SAW resonator filter on the low-frequency side thereof and preferably does not have reflectors. With this construction, because the second one-port SAW resonator filter is connected in series with the central IDT, i.e. the output side, of the vertically connected double mode SAW resonator filter, it is possible to further increase the amount of attenuation in the blocking region without losing power-resistance or reflection coefficient of the input side terminal in the blocking region.

According to a further specific aspect of the invention, as well as the above-mentioned second one-port SAW resonator filter, a third one-port SAW resonator filter is also connected to the three-electrode vertically connected double mode SAW resonator filter. However, the third one-port SAW resonator filter is connected in parallel with the double mode SAW resonator filter. In a specific example, the third one-port SAW resonator filter is connected to the double mode SAW resonator filter by way of the second one-port SAW resonator filter. This third one-port SAW resonator filter has its resonance frequency on the low-frequency side of the pass band of the vertically connected double mode SAW resonator filter and preferably does not have reflectors.

With this construction, because in addition to the second one-port SAW resonator filter connected in series with the output side of the vertically connected double mode SAW resonator filter a third one-port SAW resonator filter is connected in parallel with the double mode SAW resonator filter, it is possible to further increase the amount of attenuation in the blocking region without losing power-resistance or reflection coefficient of the input side terminal in the blocking region.

Other features and advantages of the present invention will become apparent from the following description of the invention which refers to the accompanying drawings.

BRIEF DESCRIPTION OF THE DRAWING(S)

Figure 3A:
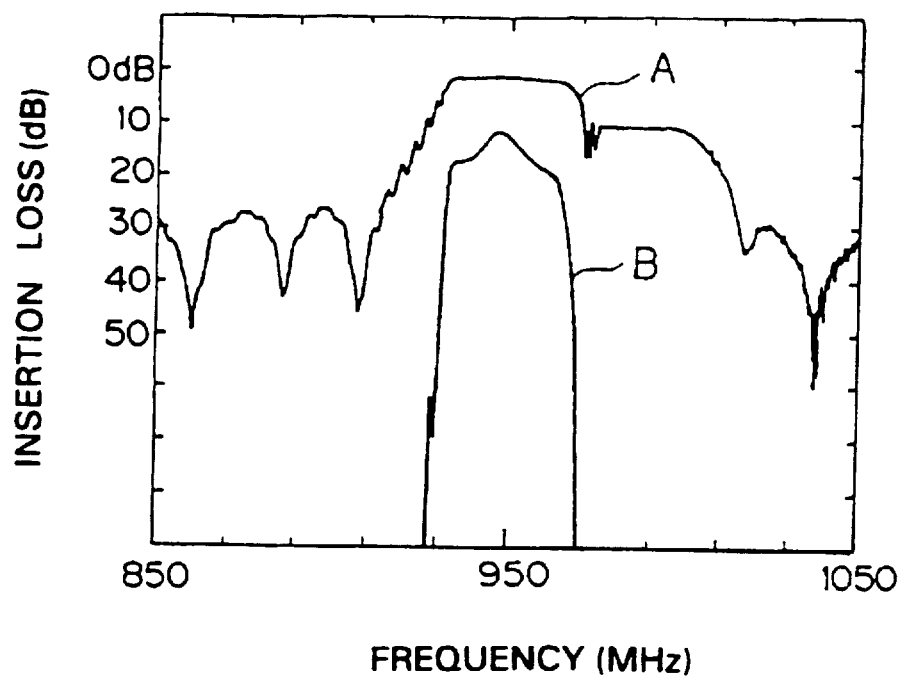
Figure 3B:
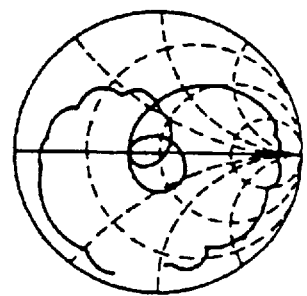
Figure 3C:
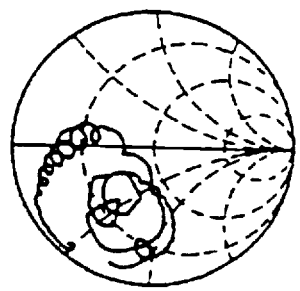
Figure 4A:
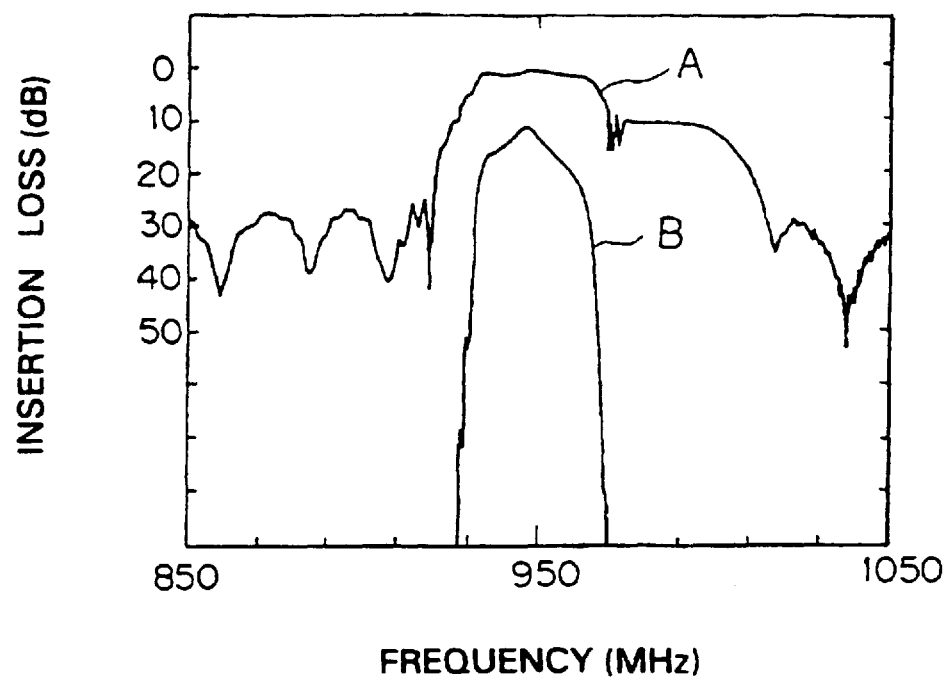
Figure 4B:
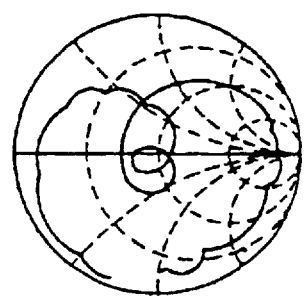
Figure 4C:
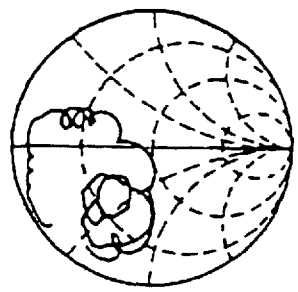
Figure 5:
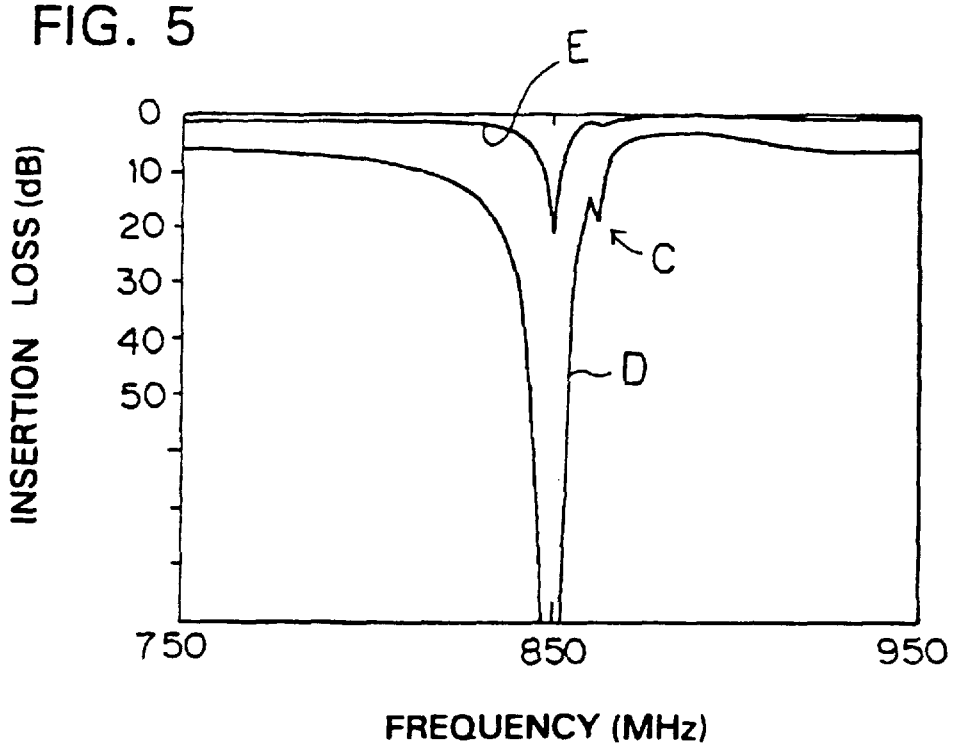
Figure 6:
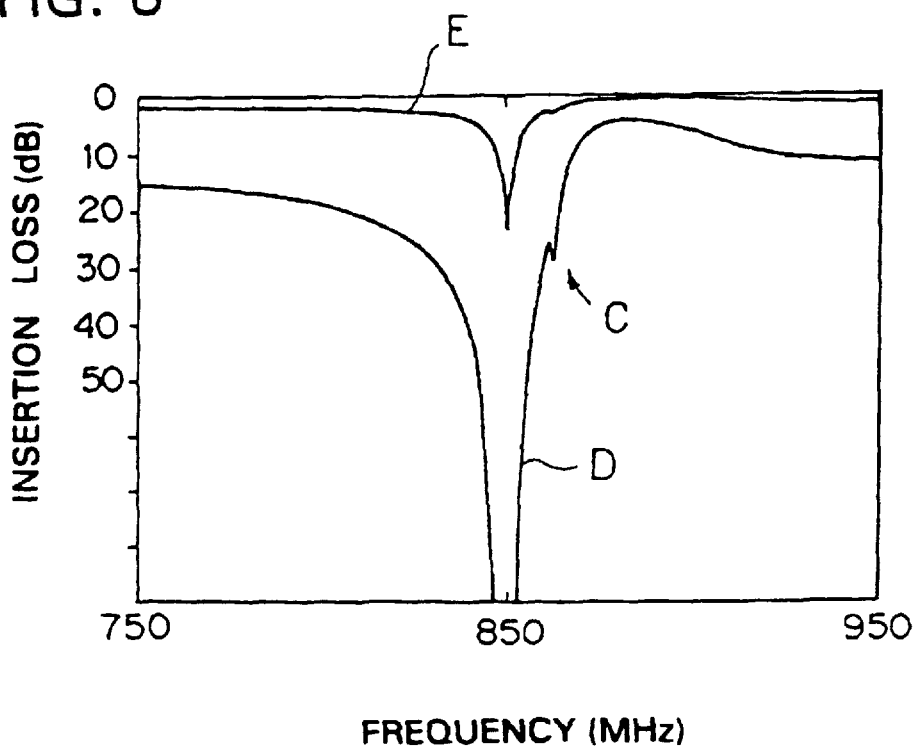
Figure 7:
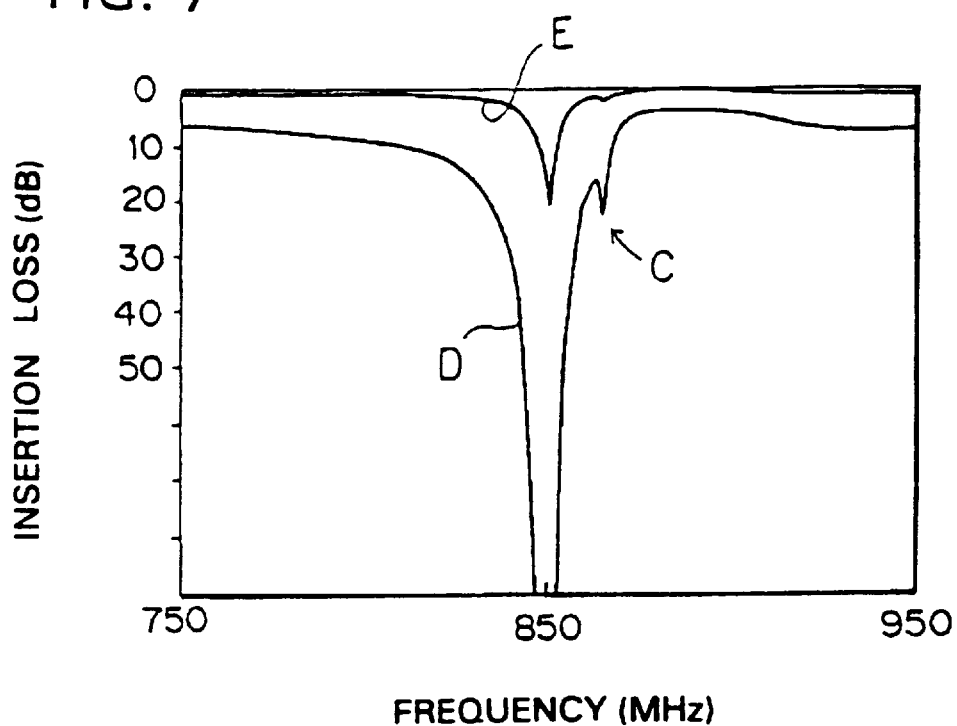
Figure 8:
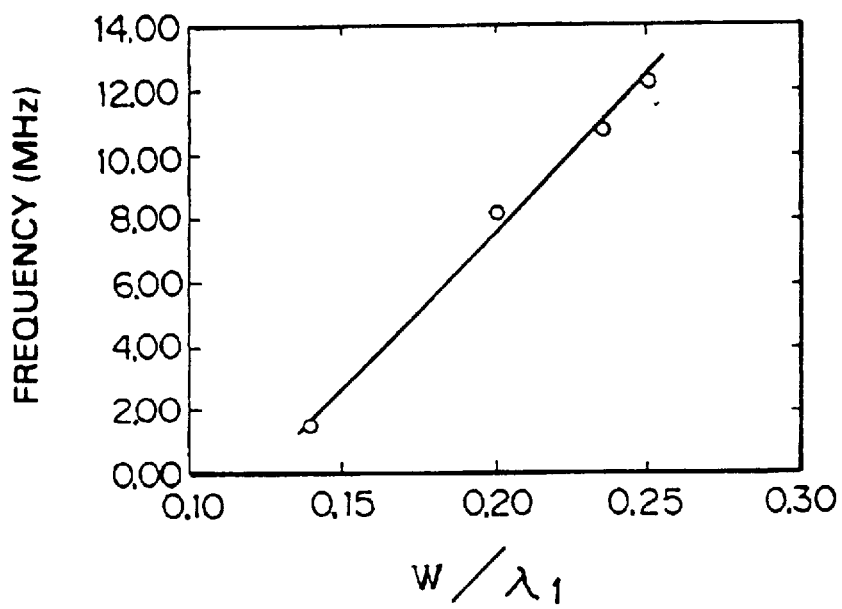
Figure 9:
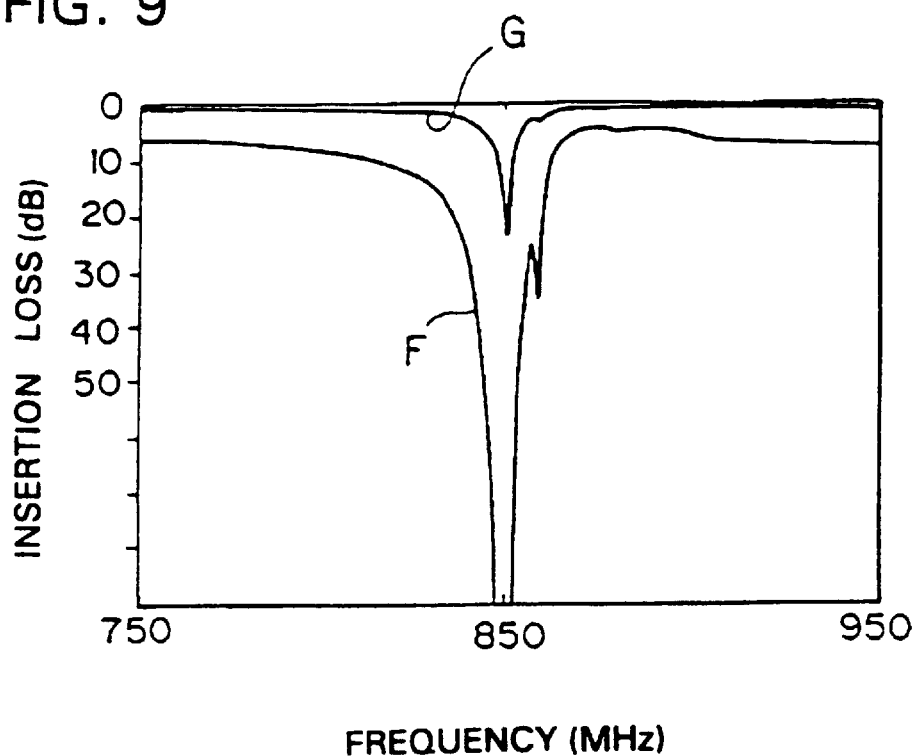
Figure 10:
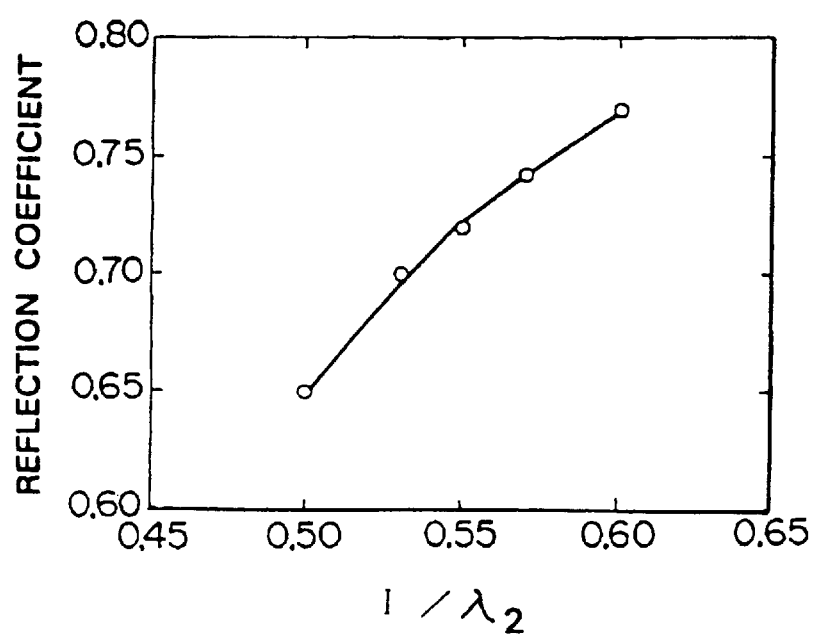
Figure 11:
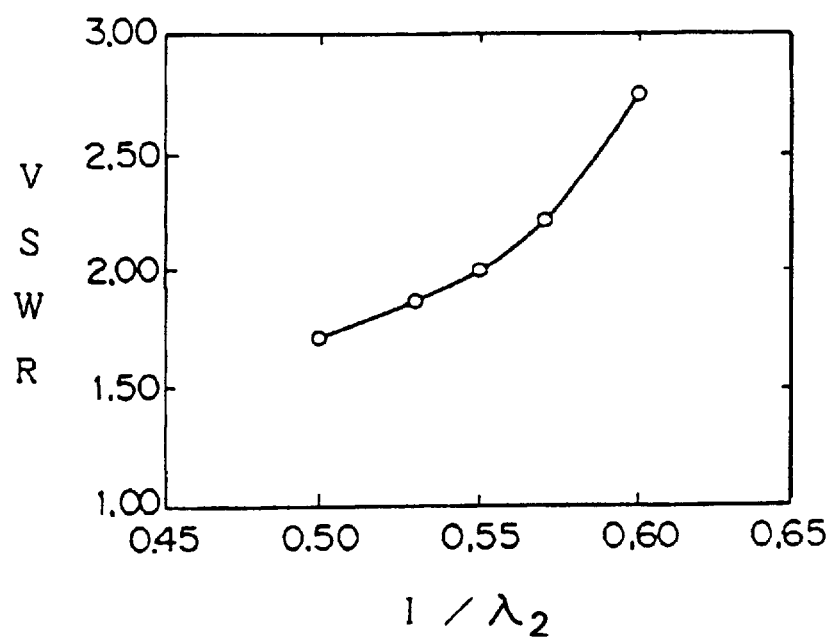
Figure 12:
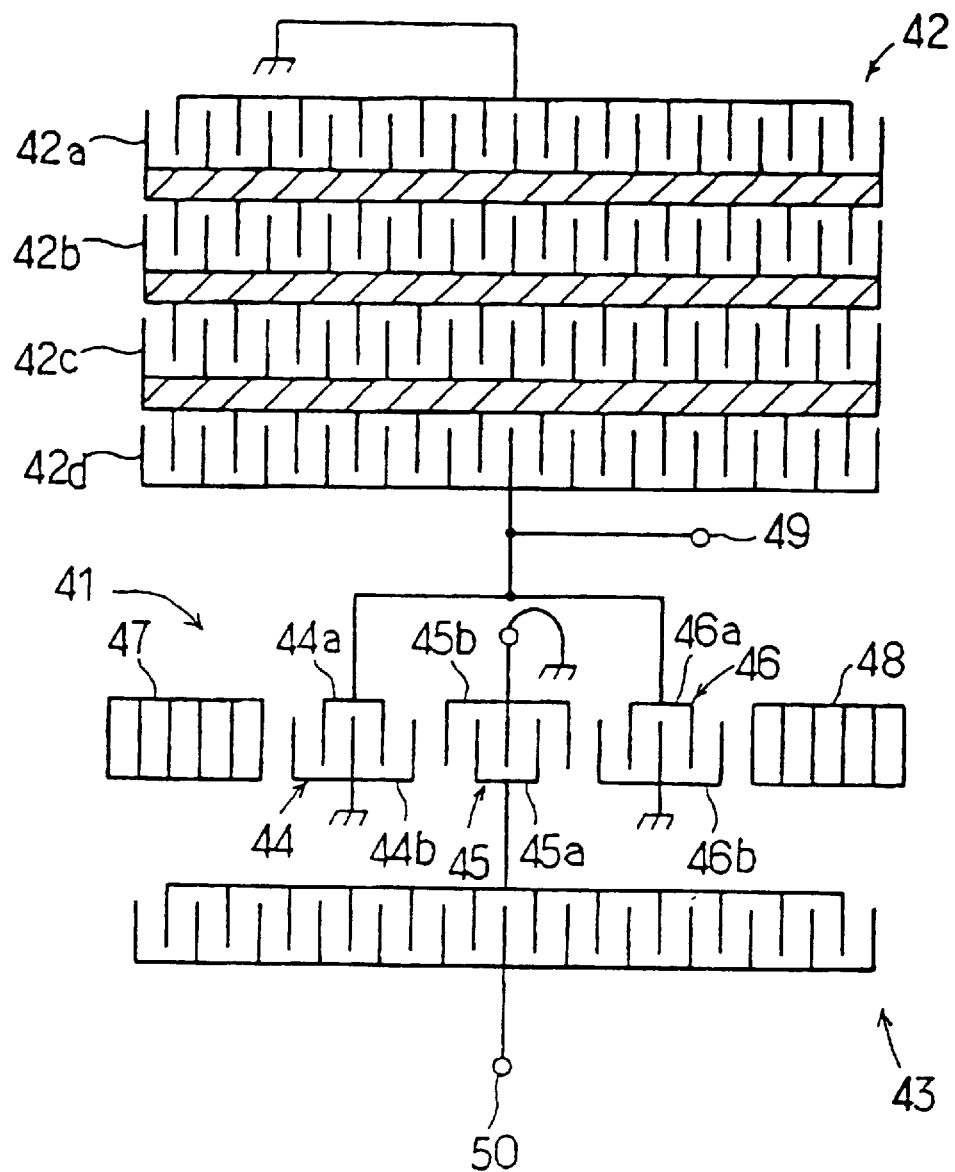
Figure 13:
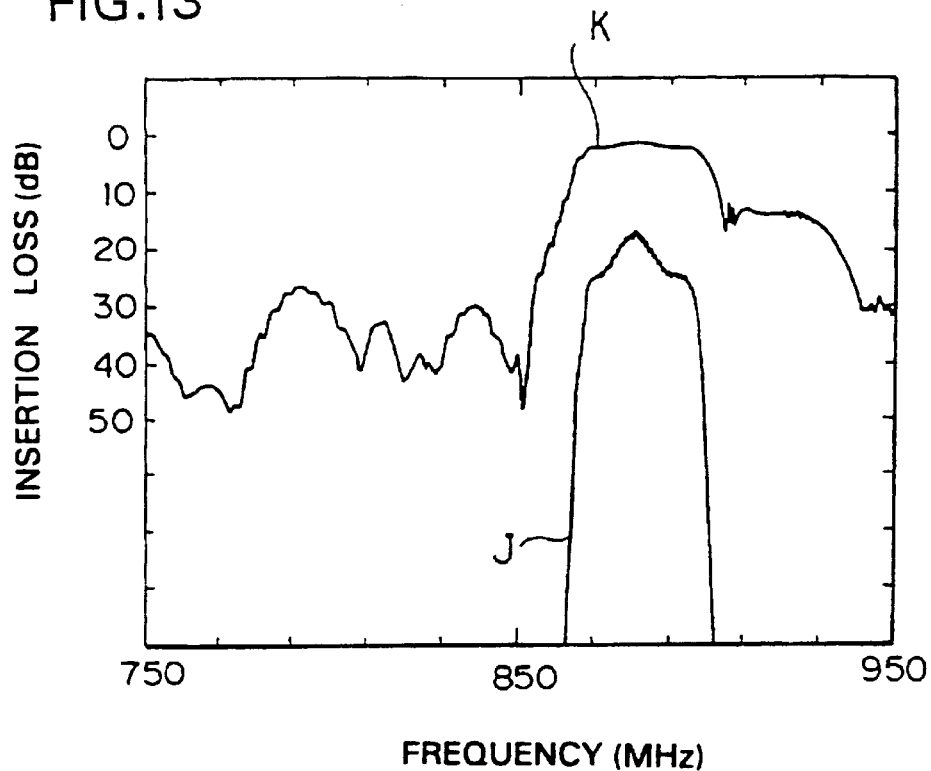
Figure 14:
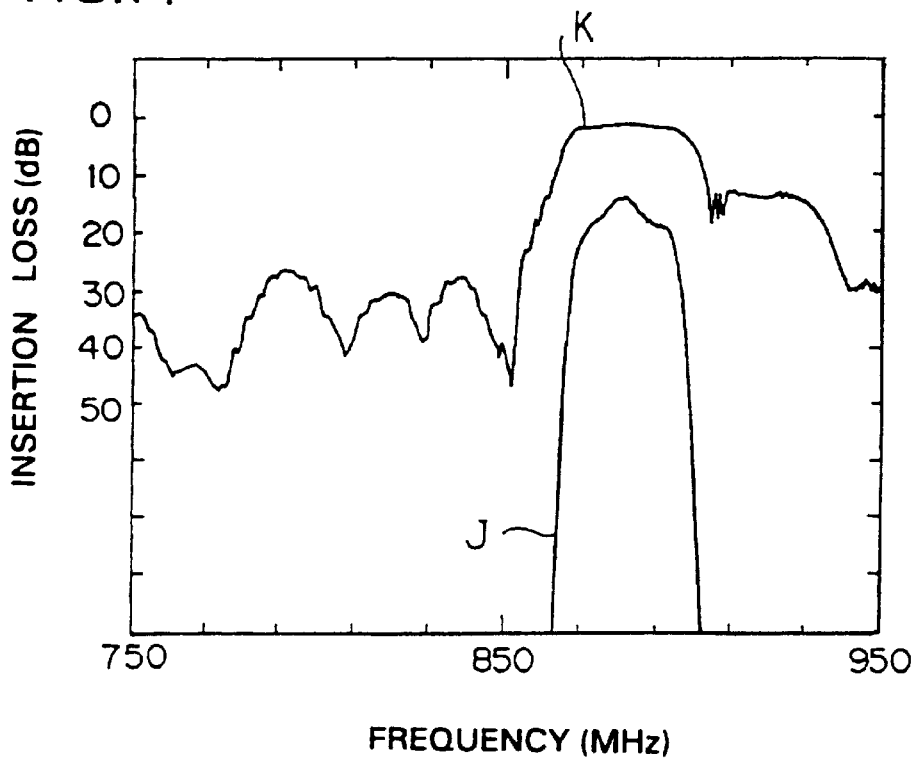
Figure 15:
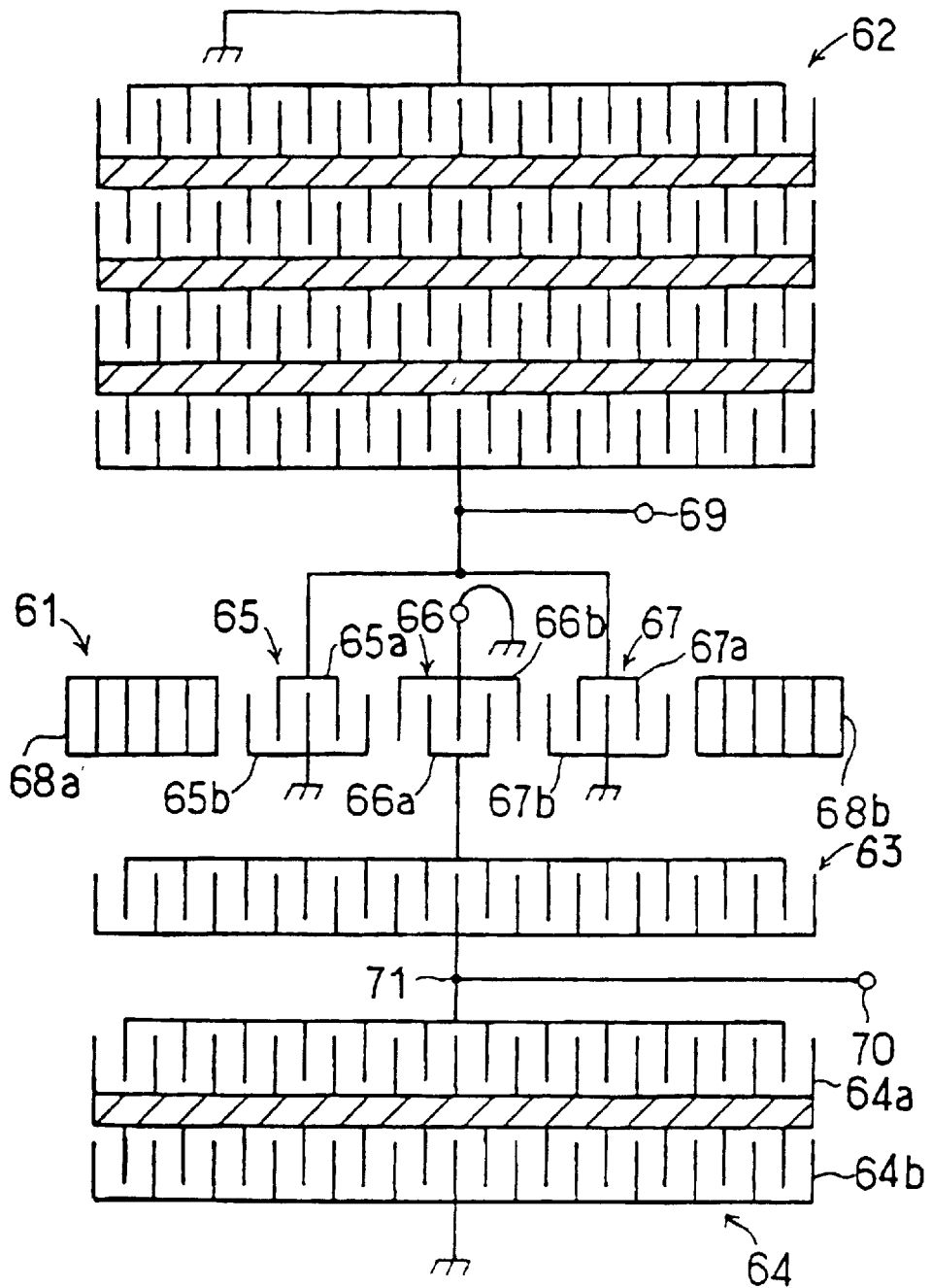
Figure 16:
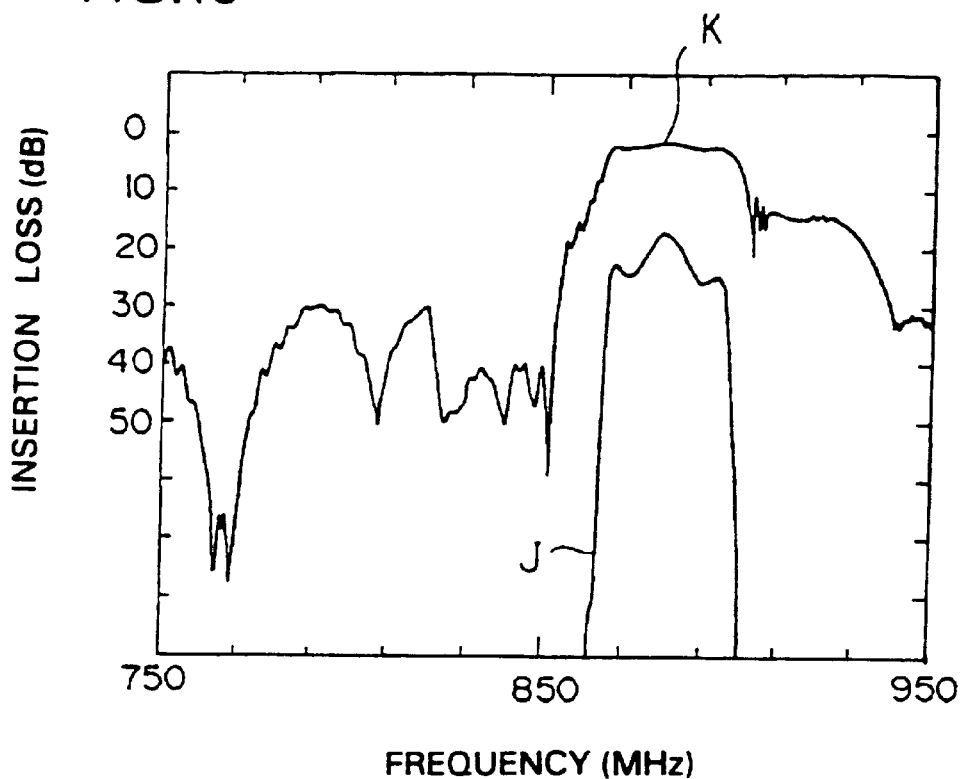
Figure 17:
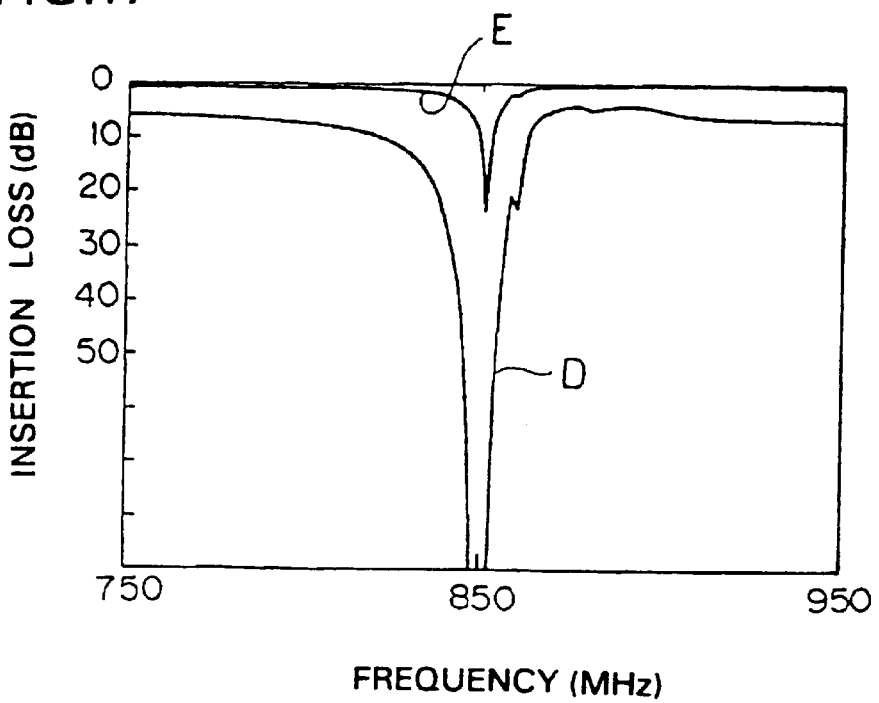
Figure 18:
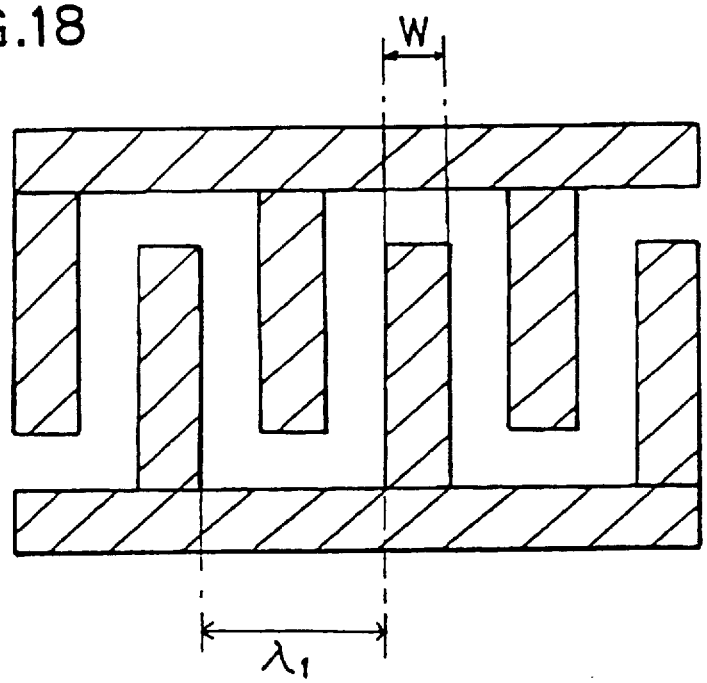
Figure 19:
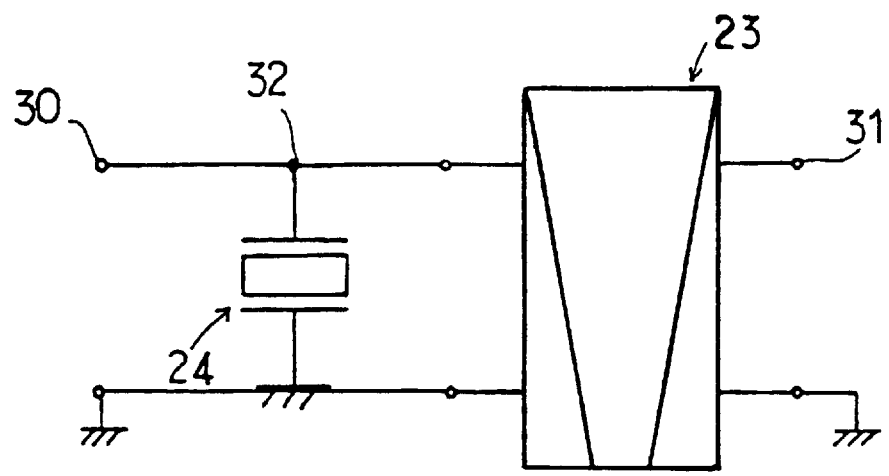

FIG. 3(a), 3(b) and 3(c) are charts showing characteristics of a vertically connected double mode SAW resonator filter, FIG. 3(a) showing an insertion loss—frequency characteristic, FIG. 3(b) being a Smith impedance chart for a central IDT side terminal and FIG. 3(c) being a Smith impedance chart for an outer IDT side terminal;

FIG. 4(a), 4(b) and 4(c) are charts showing characteristics of a surface acoustic wave device of the first preferred embodiment as a whole, FIG. 4(a) showing an insertion loss—frequency characteristic, FIG. 4(b) being a Smith impedance chart for a central IDT side terminal and FIG. 4(c) being a Smith impedance chart for an outer IDT side terminal;

FIG. 5 is a chart showing an insertion loss—frequency characteristic of a first one-port SAW resonator filter of 4-stage construction;

FIG. 6 is a chart showing an insertion loss—frequency characteristic of a first one-port SAW resonator filter of 3-stage construction;

FIG. 7 is a chart showing an attenuation level—frequency characteristic of a first one-port SAW resonator filter of 2-stage construction;

FIG. 8 is a chart showing a relationship between $w/\lambda_1$, and the difference between a resonance frequency and the frequency at which a spurious response occurs;

FIG. 9 is a chart showing an insertion loss—frequency characteristic of a first one-port SAW resonator filter of 4-stage construction wherein $h/\lambda_1$=about 6.5% and $w/\lambda_1$=⅕;

FIG. 10 is a chart showing a relationship between the spacing I between IDTs and reflectors of a three-electrode vertically connected double mode SAW resonator filter and the minimum value of a reflection coefficient in a blocking region;

FIG. 11 is a chart showing a relationship between the spacing I between IDTs and reflectors of a vertically connected double mode SAW resonator filter and the maximum value of VSWR in a pass band;

FIG. 12 is a schematic plan view showing an electrode structure of a surface acoustic wave device according to a second preferred embodiment of the invention;

FIG. 13 is a chart showing an attenuation level—frequency characteristic of a surface acoustic wave device according to the second preferred embodiment;

FIG. 14 is a chart showing an insertion loss—frequency characteristic of a surface acoustic wave device of the second preferred embodiment before a second one-port SAW resonator filter is connected;

FIG. 15 is a schematic plan view illustrating an electrode structure of a surface acoustic wave device according to a third preferred embodiment of the invention;

FIG. 16 is a chart showing an insertion loss—frequency characteristic of a surface acoustic wave device according to the third preferred embodiment;

FIG. 17 is a chart showing an insertion loss—frequency characteristic of a modified version of the first preferred embodiment when $t/\lambda_1$=3.2;

FIG. 18 is an enlarged plan view showing IDTs in a surface acoustic wave device of the first preferred embodiment; and FIG. 19 is a view showing the circuit construction of a surface acoustic wave device of the first preferred embodiment.

DETAILED DESCRIPTION OF EMBODIMENTS OF THE INVENTION

Preferred embodiments of the invention will now be described with reference to the accompanying drawings.

Figure 2:
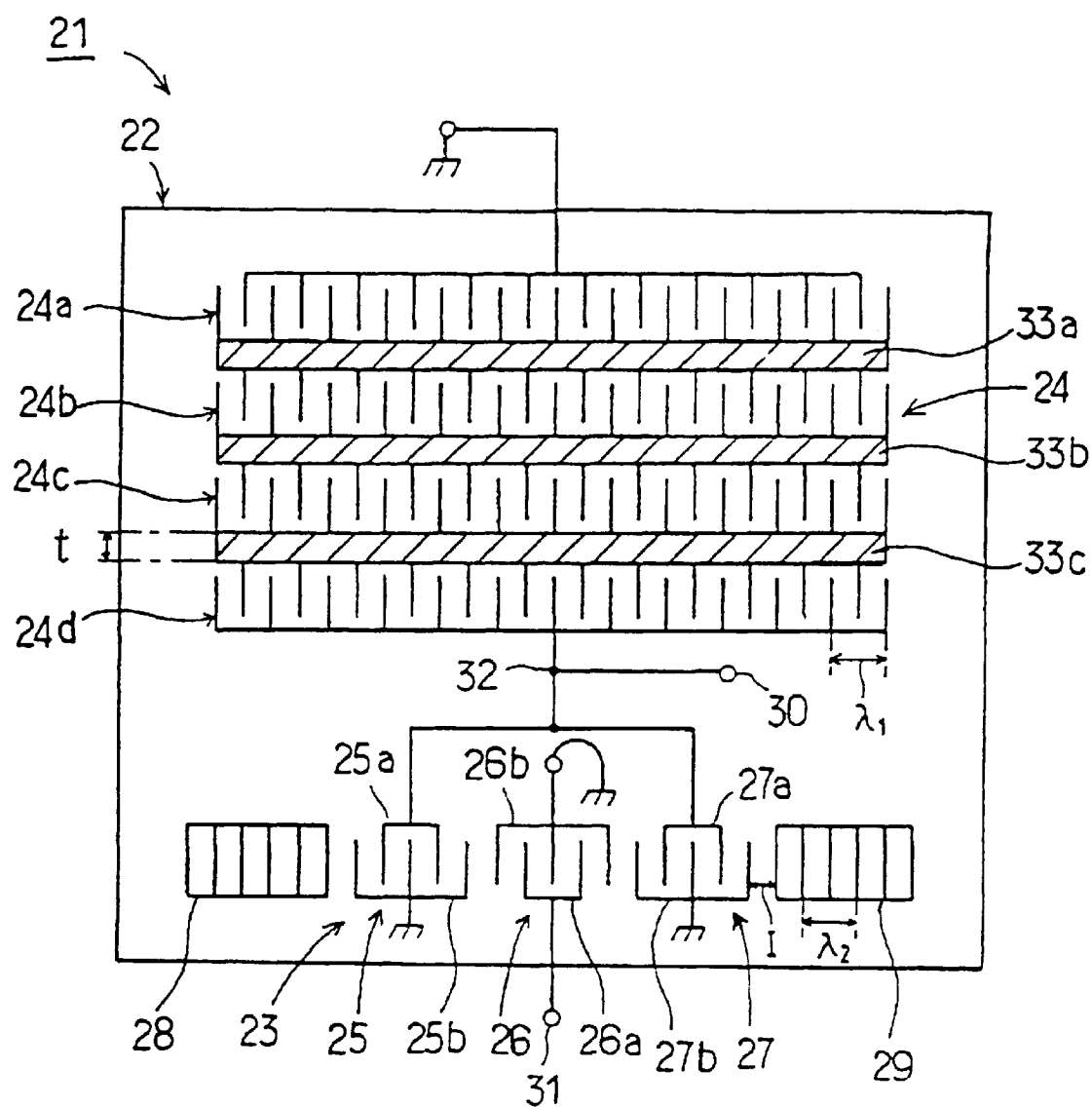
FIG. 2 is a schematic plan view of a surface acoustic wave device according to a first preferred embodiment of the invention.

FIG. 2 is a schematic plan view showing a surface acoustic wave device according to a first preferred embodiment of the invention.

A surface acoustic wave device 21 of this preferred embodiment is made using a piezoelectric substrate 22 made of 36° Y-cut, X-propagation LiTaO$_3$. The piezoelectric substrate 22 is not limited to the abovementioned material, and for example 64° Y-cut, X-propagation LiNbO$_3$ or 41° Y-cut, X-propagation LiNbO$_3$ may alternatively be used.

FIG. 2 schematically shows an electrode structure formed on the piezoelectric substrate 22. On the piezoelectric substrate 22 are formed a three-electrode vertically connected double mode SAW resonator filter 23 and a first one-port SAW resonator filter 24.

The vertically connected double mode SAW resonator filter 23 and the first one-port SAW resonator filter 24 may be formed on separate piezoelectric substrates or may be formed on a single piezoelectric substrate 22 as shown in FIG. 2.

The vertically connected double mode SAW resonator filter 23 has three IDTs 25, 26 and 27 lined up along a surface wave propagation direction. The IDTs 25 to 27 have comb electrodes 25a, 25b, 26a, 26b, 27a and 27b each having a plurality of electrode fingers. That is, the IDTs 25 to 27 each have a plurality of pairs of mutually intermeshing electrode fingers.

Grating reflectors 28 and 29 are formed at the surface wave propagation direction ends of the region where the IDTs 25 to 27 are formed.

One comb electrode 25a, 27a of each of the IDTs 25 and 27 is electrically connected to an input terminal 30. One comb electrode 26a of the IDT 26 positioned in the middle is electrically connected to an output terminal 31. The other comb electrodes 25b, 26b and 27b of the IDTs 25 to 27 are connected to a ground potential.

Also, the one-port SAW resonator filter 24 is connected between ground potential and a connection point 32 between the input terminal 30 and the IDTs 25 and 27. In other words, the input terminal 30 is led out from a connection point 32 between the vertically connected double mode SAW resonator filter 23 and the first one-port SAW resonator filter 24.

The first one-port SAW resonator filter 24 has four stages of IDTs 24a, 24b, 24c and 24d connected to each other in series. Accordingly, adjacent IDTs among the IDTs 24a to 24d have common bus bars. That is, bus bars 33a, 33b and 33c are common bus bars, and for example the bus bar 33a serves both as a bus bar connecting together a plurality of electrode fingers of one comb electrode of the IDT 24a and as a bus bar connecting together a plurality of electrode fingers of one comb electrode of the IDT 24b.

Also, as shown in FIG. 2, the first one-port SAW resonator filter 24 preferably does not have reflectors. However, as previously described, the inventor has discovered that the invention may function even if the one-port SAW resonator filter 24 has reflectors.

The IDTs 24a to 24d and 25 to 27 and the reflectors 28 and 29 can be formed using any suitable electrode materials, and in this preferred embodiment they are made of aluminum. The IDTs 24a to 24d and 25 to 27 and the reflectors 28 and 29 may alternatively be formed using an aluminum alloy with up to a few weight percent of Cu added.

FIG. 19 shows the circuit diagram of the surface acoustic wave device of the first embodiment.

An insertion loss—frequency characteristic of the SAW resonator filter 23 in the surface acoustic wave device of this preferred embodiment is shown in FIG. 3(a). In FIG. 3(a), the shape B is a characteristic curve shown with the vertical axis enlarged ten times a main part of a characteristic curve shown by the shape A.

Smith impedance charts for the vertically connected double mode SAW resonator filter 23 only are shown in FIG. 3(b) and FIG. 3(c). FIG. 3(b) shows a characteristic in the central IDT 26 and FIG. 3(c) shows a characteristic in the outer IDTs 26 and 27.

The first one-port SAW resonator filter 24 is connected to the outer IDTs 25 and 27 of the SAW resonator filter 23 so that its resonance frequency is positioned on the low-frequency side of the pass band of the vertically connected double mode SAW resonator filter 23, i.e. in the low-frequency side blocking region of the SAW resonator filter 23, and its antiresonance frequency is located inside the pass band of the SAW resonator filter 23.

The insertion loss—frequency characteristic across the input and output terminals 30, 31 of the surface acoustic wave device of this preferred embodiment constructed as described above is shown in FIG. 4(a). Also, Smith impedance charts of the surface acoustic wave device of this preferred embodiment are shown in FIG. 4(b) and FIG. 4(c). FIG. 4(b) shows a characteristic in the central IDT 26 and FIG. 4(c) shows a characteristic in the outer IDTs 25 and 27.

In FIG. 4(a), as in FIG. 3(a), the characteristic shown by the shape B is a main part of the characteristic shown by the shape A with the insertion loss scale enlarged ten times.

When the insertion loss—frequency characteristic of the SAW resonator filter 23 only shown in FIG. 3(a) and the insertion loss—frequency characteristic of this preferred embodiment shown in FIG. 4(a) are compared, it can be seen that in the blocking region on the low-frequency side of the pass band the amount of attenuation in the vicinity of the pass band is greatly increased in the case of the preferred embodiment shown in FIG. 4(a).

Also, if the characteristics shown in FIG. 3(c) and FIG. 4(c) are compared, it can be seen that with this preferred embodiment, as a result of the first one-port SAW resonator filter 24 being connected in parallel, the reflection coefficient in the blocking region is increased. Therefore, for example, when the surface acoustic wave device of this preferred embodiment is used in an antenna on the receiving side of a portable telephone or the like, the reflection coefficient in the pass band of the other caller's side, i.e. the transmission side, can effectively be raised.

The pass band of the SAW resonator filter 23 is 935 to 960 MHz, and the low-frequency side blocking region is 890 to 915 MHz.

Thus, in the surface acoustic wave device of this preferred embodiment, because the first one-port SAW resonator filter 24 having its resonance frequency positioned on the low-frequency side of the pass band is connected in parallel with the vertically connected double mode SAW resonator filter 23, it is possible to increase the amount of attenuation in the blocking region on the low-frequency side of the pass band. Also, because it is possible to make the reflection coefficient in this blocking region large, for example, when the surface acoustic wave device is used in an antenna of a portable telephone or the like, it is possible to suppress losses in the pass band of the filter on the other caller's side, that is, the transmission side.

Also, because the one-port SAW resonator filter 24 is connected in parallel, impressed power is divided between the vertically connected double mode SAW resonator filter 23 and the first one-port SAW resonator filter 24.

Example of First Preferred Embodiment

The reason why blocking breaks down when a large power signal is fed into a surface acoustic wave filter is that migration occurs between electrode fingers of the IDTs due to mechanical stress when the surface waves are excited. Therefore, preferably, in the surface acoustic wave device of the preferred embodiment shown in FIG. 2, the sum of the number of electrode fingers of the IDTs 25 and 27 of the vertically connected double mode SAW resonator filter 23 is greater than the number of electrode fingers of the central IDT 26. When this construction is adopted, because power is impressed on the outer IDTs 25 and 27, which have more electrode fingers, and the first one-port SAW resonator filter 24 having a plurality of IDTs each having multiple pairs of electrode fingers and connected to each other in series in a plurality of stages as described above is connected to the IDTs 25 and 27, the total area of the electrode fingers of the IDTs on which the power is impressed can be made large and thereby it is possible to thereby further improve the power-resistance of the input side terminal in the blocking region.

Figure 1:
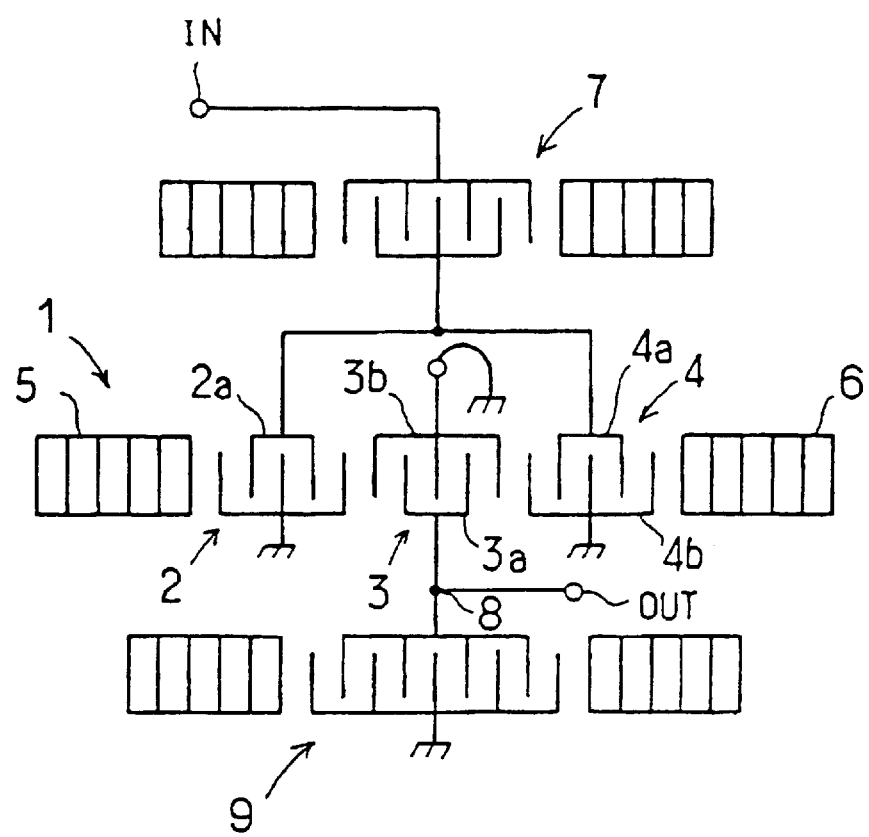
FIG. 1 is a schematic plan view illustrating an electrode structure of a conventional surface acoustic wave device.

When a surface acoustic wave device of this preferred embodiment was made using Al containing 1.5 wt % of Cu as an additive for the IDT electrodes, whereas with the conventional surface acoustic wave device shown in FIG. 1 when a power of 2 W was impressed in the blocking region, breaking down of the surface acoustic wave device immediately occurred, with the surface acoustic wave device of this preferred embodiment, when a power of 2 W was impressed in the blocking region at an ambient temperature of 85°, even at a frequency position in the blocking region, where the power-resistance is the lowest, it was confirmed that the device had a life of over 70 hours. Therefore, with the surface acoustic wave device of this preferred embodiment, it is possible to provide a surface acoustic wave device which not only is low-loss in the pass band and has a large amount of attenuation but also has superior power-resistance.

Other Example of First Preferred Embodiment

In the surface acoustic wave device of the preferred embodiment shown in FIG. 2, the first one-port SAW resonator filter 24 was made by connecting together in series four IDTs each having multiple pairs of electrode fingers. In this case, the opening length and the number of pairs of electrode fingers of all the IDTs 24a to 24d were made the same.

The first one-port SAW resonator filter 24 does not necessarily have to be of a 4-stage construction wherein four IDTs are connected in series as described above, and may alternatively be of a 3-stage or 2-stage construction. However, by the first one-port SAW resonator filter 24 being constructed so that it has numerous stages it is possible to increase the electrode area and thereby it is possible to improve the power-resistance of the device.

Insertion loss—frequency characteristics for when the first one-port SAW resonator filter 24 is made 4-stage, 3-stage and 2-stage are shown in FIG. 5 to FIG. 7 respectively. The curve D in FIG. 5 to FIG. 7 is a characteristic curve shown with the size of the insertion loss of the vertical axis enlarged ten times with respect to the characteristic shown by the curve E.

As is apparent from FIG. 5 to FIG. 7, in comparison with the 3-stage construction, it is possible with the 4-stage construction and the 2-stage construction to reduce losses in the low-frequency side region of the inside of the pass band. Therefore, the device can be used effectively in portable telephones and the like wherein the difference between the transmission frequency and the reception frequency is narrow.

The insertion loss—frequency characteristics shown in FIG. 5 to FIG. 7 are characteristics of cases where the pass band is 869 to 894 MHz.

As mentioned above, by giving the first one-port SAW resonator filter a multi-stage construction it is possible to raise the power-resistance of the device but there is the problem that a spurious response existing between the resonance frequency and the antiresonance frequency of the one-port SAW resonator filter becomes large. That is, there is a problem that the spurious response shown by the arrow C in FIG. 5 becomes large.

In a preferable aspect of the first preferred embodiment, to reduce the above-mentioned spurious response, the ratio of the line width w of the electrode fingers of the first one-port SAW resonator filter shown in FIG. 2 and FIG. 18 and the wavelength $\lambda_1$ of the excited surface waves is made less than ¼. The reason why it is possible to reduce the above-mentioned spurious response by making $w/\lambda_1$ less than ¼ in this way will now be explained.

FIG. 8 is a chart showing a relationship between the ratio with respect to the wavelength $\lambda_1$ of the line width w of the electrode fingers of the IDTs 24a to 24d of a first one-port SAW resonator filter 24 constructed so that its resonance frequency is 850 MHz, i.e. having the thickness of the electrodes of the IDTs made about 6.5% of the wavelength $\lambda_1$, and the frequency difference between this resonance frequency and the frequency at which the spurious response occurs. As is clear from FIG. 8, when $w/\lambda_1=0.25$ (¼) the above-mentioned frequency difference is 12.5 MHz. Therefore, when dispersion in frequency during manufacture and effects of fluctuations in operating temperature are taken into account, the spurious response occurs inside the pass band and losses inside the pass band become large.

On the other hand, FIG. 9 shows the insertion loss—frequency characteristic of a 4-stage first one-port SAW resonator filter 24 wherein $w/\lambda_1=\frac{1}{5}$ and the electrode thickness h is such that $h/\lambda_1$ =about 6.5%.

The curve F is a characteristic shown with the insertion loss scale of the vertical axis enlarged ten times with respect to the characteristic shown by the curve G.

As is clear from FIG. 9, here, the difference between the resonance frequency and the frequency position at which the spurious response occurs is less than 8.5 MHz. Therefore, it can be seen that the spurious response does not have an effect on the inside of the pass band.

Furthermore, it can be seen that by making the line width w of the electrode fingers of the IDTs 24a to 24d of the first one-port SAW resonator filter 24 such that $w/\lambda_1<¼$ it is possible to suppress breaking down caused by shorting between the hot sides and the ground sides of the IDTs 24a to 24d due to migration between electrode fingers when power is impressed thereon. That is, it is possible to make the life of the device until this kind of breaking down occurs long.

Also, even when a first one-port SAW resonator filter 24 of the kind described above is connected in parallel with the double mode SAW resonator filter 23, the effect on the pass band of making the line width w small is small and therefore it is possible to improve the power-resistance without bringing about deterioration of insertion loss in the pass band of the surface acoustic wave device as a whole.

Further Preferable Example of First Preferred Embodiment

In a surface acoustic wave device of the first preferred embodiment, preferably, when the spacing between the centers of the outer end electrode fingers of the outer IDTs 25 to 27 of the vertically connected double mode SAW resonator filter 23 and the centers of the inner end electrodes of the reflectors is I and the repetition wavelength of the electrodes of the reflectors is written $\lambda_2$ (see FIG. 2), the SAW resonator filter 23 is constructed so that the relationship:

$$0.53 \leq I/\lambda_2 \leq 0.59$$

is satisfied. The above-mentioned 'I', more specifically, as shown in FIG. 2, is, for example, the distance between the center of the outermost electrode finger of the outer IDT 27 and the center of the innermost electrode of the reflector 29 positioned on the outer side thereof.

FIG. 10 is a chart showing the relationship between the above-mentioned $I/\lambda_2$ and the minimum value of the reflection coefficient in the blocking region in the vertically connected double mode SAW resonator filter 23 and FIG. 11 shows the relationship between $I/\lambda_2$ and the maximum value of VSWR in the pass band thereof.

The above-mentioned characteristics are characteristics of a filter wherein the pass band of the SAW resonator filter 23 is 849 to 869 MHz, the blocking region is 824 to 849 MHz and further taking into account frequency dispersion the pass band is ±2 MHz wider at 29 MHz.

As is clear from FIG. 10 and FIG. 11, when the spacing I between the outer IDTs and the reflectors of the SAW resonator filter 23 is 0.53 $\lambda_2$ or less, the reflection coefficient in the blocking region becomes less than 0.7, and practical problems arise. On the other hand, as is clear from FIG. 11, when the spacing I is greater than 0.59$\lambda_2$, the VSWR becomes larger than 2.5. Therefore, as is clear from the results of FIG. 10 and FIG. 11, the spacing I is preferably above 0.53$\lambda_2$ and less than 0.59$\lambda_2$.

Accordingly, when a surface acoustic wave device according to this modification example is used, for example, as a receiving side filter of an antenna of a portable telephone and connected to a transmission side filter, the reflection coefficient of the receiving side filter in the transmission side pass band can be made large, the impedance thereof becomes closer to open and consequently it is possible to suppress deterioration of the characteristics of the transmission side filter.

Further Preferred Example of a Surface Acoustic Wave Device of the First Preferred Embodiment In the surface acoustic wave device shown in FIG. 2, preferably, the ratio of the spacing t between the IDTs 24a, 24b, 24c and 24d of the first one-port SAW resonator filter 24 to the wavelength $\lambda_1$ of the resonators constituted by the IDTs satisfies $t/\lambda_1 >3$. By making $t/\lambda_1 >3$ in this way, it is possible to reduce ripples in the pass band caused by the spurious response existing between the resonance frequency and the antiresonance frequency. This will now be explained with reference to FIG. 9 and FIG. 17.

As described above, by giving the first one-port SAW resonator filter 24 a multi-stage construction it is possible to increase the electrode area and thereby increase the power-resistance. However, when the first one-port SAW resonator filter 24 is made multi-stage, the spurious response existing between the resonance frequency and the antiresonance frequency thereof becomes large. That is, the spurious response shown by the arrow C in FIG. 5 becomes large.

On the other hand, the characteristic shown in FIG. 9 is that of a case wherein the first one-port SAW resonator filter 24 has been made 4-stage and also the ratio of the spacing t between the IDTs 24a to 24d to the wavelength $\lambda_1$ is $t/\lambda_1$ =2.1. Here, it can be seen that the ripple in the pass band is about 2 dB.

With respect to this, FIG. 17 shows an insertion loss—frequency characteristic of a case wherein the above-mentioned $t/\lambda_1$ is 3.2. The rest of the construction is the same as in the case shown in FIG. 9.

Comparing the characteristics shown in FIG. 9 and FIG. 17, it is clear that in the characteristic shown in FIG. 17 the ripple in the pass band has been reduced to about ¼th of its size in the characteristic shown in FIG. 9. That is, it is possible to reduce the ripple in the pass band as described above by making the spacing t such that $t/\lambda_1$=3.2. Experiments carried out by the present inventors have confirmed that if the above-mentioned $t/\lambda_1$ is made larger than 3 it is possible to make the ripple inside the pass band small as in the case of the characteristic shown in FIG. 17.

Therefore, when the first one-port SAW resonator filter 24 is made multi-stage, by making $t/\lambda_1$ larger than 3 it is possible to increase the power-resistance without deteriorating the characteristic inside the pass band.

Second Preferred Embodiment

FIG. 12 is a schematic plan view illustrating an electrode structure of a surface acoustic wave device according to a second preferred embodiment of the invention.

In FIG. 12, although a piezoelectric substrate is not shown, a piezoelectric substrate consists of a 36° Y-cut, X-propagation LiTaO₃ and the electrode structure shown in FIG. 12 is formed on this piezoelectric substrate. As the piezoelectric substrate, 64° Y-cut, X-propagation LiNbO₃ or 41° Y-cut, X-propagation LiNbO₃ or the like can alternatively be used.

A three-electrode vertically connected double mode SAW resonator filter 41, a first one-port SAW resonator filter 42 and a second one-port SAW resonator filter 43 are formed on this piezoelectric substrate.

The vertically connected double mode SAW resonator filter 41 is constructed in the same way as the vertically connected double mode SAW resonator filter 23 described in the first preferred embodiment. That is, it has three IDTs 44 to 46. Reflectors 47 and 48 are formed at the ends of the region where the IDTs 44 to 46 are formed.

One comb electrode 44a, 46a of each of the IDTs 44 and 46 is connected to an input terminal 49. The other comb electrodes 44b, 46b are connected to a ground potential. One comb electrode 45a of the IDT 45 is connected to an output terminal 50 by way of the second one-port SAW resonator filter 43. The other comb electrode 45b is connected to the ground potential.

The first one-port SAW resonator filter 42 is connected between the input terminal 49 and the ground potential. The first one-port SAW resonator filter 42 is constructed in the same way as the first one-port SAW resonator filter 24 described in the first preferred embodiment. Accordingly, the first one-port SAW resonator filter 42 has IDTs 42a, 42b, 42c and 42d connected in series with each other. That is, the first one-port SAW resonator filter 42 consists of four stages of IDTs connected in series. Preferably, it does not have reflectors, as shown, though it may have reflectors.

As mentioned above, the first one-port SAW resonator filter 42 is connected between the ground potential and a point between the input and the output.

In a surface acoustic wave device of this preferred embodiment, the construction of the input side of the first one-port SAW resonator filter 42 is the same as in the first preferred embodiment. What is different is the output side of the vertically connected double mode SAW resonator filter 41, and namely that the second one-port SAW resonator filter 43 is connected to the output side of the vertically connected double mode SAW resonator filter 41. In other words, the second one-port SAW resonator filter 43 is connected in series with the vertically connected double mode SAW resonator filter 41.

In this preferred embodiment also, the first one-port SAW resonator filter 42 is a resonator of 4-stage construction and is constructed so that its resonance frequency is positioned to the low-frequency side of the pass band of the SAW resonator filter 41, i.e. in the high-frequency side of the low-frequency side blocking region, and its antiresonance frequency is in the pass band of the SAW resonator filter 41.

Therefore, as in the case of the first preferred embodiment, it is possible to increase the amount of attenuation in the high-frequency side of the blocking region on the input side and the power-resistance is raised by the electrode area being increased. Furthermore, in this preferred embodiment also, in the SAW resonator filter 41, the sum of the numbers of electrode fingers of the outer IDTs is greater than the number of electrode fingers of the central IDT and therefore together with the connection of the abovementioned first one-port SAW resonator filter 42 as a multi-stage resonator the total area of the IDT electrodes on which power is impressed is increased and the power-resistance of the device is improved.

Furthermore, in this preferred embodiment, unlike in the first preferred embodiment, the second one-port SAW resonator filter 43 is connected in series with the central IDT 45 of the SAW resonator filter 41. This second one-port SAW resonator filter 43 is so constructed that its antiresonance frequency is on the low-frequency side of the blocking region of the vertically connected double mode SAW resonator filter 41 and it preferably does not have reflectors, as shown, although it may have reflectors. Therefore, as is clear from experimental examples which will be discussed later, it is possible to increase the amount of attenuation in the low-frequency side of the blocking region also. This will now be explained with reference to FIG. 13 and FIG. 14. The characteristic J in FIG. 13 and FIG. 14 shows a characteristic with the scale of the vertical axis shown for the characteristic K enlarged ten times.

FIG. 13 shows an insertion loss—frequency characteristic inside the pass band of this preferred embodiment. FIG. 14 shows an insertion loss—frequency characteristic of a surface acoustic wave device in the second preferred embodiment before the second one-port SAW resonator filter 43 is connected. Comparing FIG. 13 and FIG. 14, it can be seen that in this preferred embodiment not only is the amount of attenuation in the high-frequency side of the blocking region increased but furthermore the amount of attenuation in the low-frequency side of the blocking region is increased also.

The surface acoustic wave device characteristics shown in FIG. 13 and FIG. 14 are those of a case where the pass band of the SAW resonator filter 41 is 869 to 894 MHz and the blocking region is 824 to 849 MHz.

Third Preferred Embodiment

FIG. 15 is a schematic plan view showing the electrode structure of a surface acoustic wave device according to a third preferred embodiment of the invention. In a surface acoustic wave device of this preferred embodiment, a 36° Y-cut, X-propagation piezoelectric substrate is used. That is, the electrode structure shown in FIG. 15 is formed on this piezoelectric substrate. However, as the piezoelectric substrate, besides a 36° Y-cut, X-propagation $LiTaO_3$ substrate, 64° Y-cut, X-propagation $LiNbO_3$ or 41° Y-cut, X-propagation $LiNbO_3$ or the like may alternatively be used.

Referring to FIG. 15, a surface acoustic wave device of the third preferred embodiment is made up of a three-electrode vertically connected double mode SAW resonator filter 61, a first one-port SAW resonator filter 62, a second one-port SAW resonator filter 63 and a third one-port SAW resonator filter 64. Of these, the vertically connected double mode SAW resonator filter 61, the first one-port SAW resonator filter 62 and the second one-port SAW resonator filter 63 are constructed in the same way as the vertically connected double mode SAW resonator filter 41, the first one-port SAW resonator filter 42 and the second one-port SAW resonator filter 43 of the second preferred embodiment shown in FIG. 12. Accordingly, identical parts have been given corresponding reference numbers, the description thereof made in the second preferred embodiment will be adopted and no further detailed description of these parts will be made here.

The vertically connected double mode SAW resonator filter 61 and the second one-port SAW resonator filter 63 are connected in series between an input terminal 69 and an output terminal 70. The vertically connected double mode SAW resonator filter 61 has three IDTs 65 to 67 in its center. Reflectors 68a and 68b are formed at the ends of the line of IDTs 65 to 67. One comb electrode 65a, 67a of each of the outer IDTs 65 and 67 is connected to the input terminal 69. The first one-port SAW resonator filter 62 is also connected to these comb electrodes 65a and 67a of the IDTs 65 and 67.

The other comb electrodes 65b and 67b of the IDTs 65 and 67 are connected to a ground potential, and one comb electrode 66a of the central IDT 66 is connected to the output terminal 70 by way of the second one-port SAW resonator filter 63. Also, the comb electrode 66b is connected to the ground potential.

The resonance frequencies and antiresonance frequencies of the first and second SAW resonator filters 62 and 63 are set in the same way as in the second preferred embodiment. Therefore, in this preferred embodiment also, the effects obtained in the surface acoustic wave device of the second preferred embodiment can be obtained. That is, on the input side, because the first one-port SAW resonator filter 62 of 4-stage construction is connected in parallel with the double mode SAW resonator filter 61 and in the SAW resonator filter 61 the sum of the numbers of electrode fingers of the outer IDTs 65 and 67 is greater than the number of electrode fingers of the central IDT 66, it is possible to raise the power-resistance of the device by increasing the electrode area. In addition, because the second one-port SAW resonator filter 63 is connected on the output side as a series resonator, it is possible to raise the amount of attenuation in the high-frequency side of the blocking region also.

Furthermore, in this preferred embodiment, on the above-mentioned output side, the third one-port SAW resonator filter 64 is connected between the ground potential and a connection point 71 between the output terminal 70 and the second one-port SAW resonator filter 63. The third one-port SAW resonator filter 64 has a structure wherein two IDTs 64a and 64b, each having multiple electrode fingers, are connected in series and is so constructed that its antiresonance frequency is in the low-frequency side of the blocking region of the vertically connected double mode SAW resonator filter 61 and it preferably does not have reflectors, as shown, although it may have reflectors. Although in this preferred embodiment the third one-port SAW resonator filter 64 is constructed by connecting two stages of IDT 64a and 64b in series, the number of stages is not so limited.

In this preferred embodiment, the first one-port SAW resonator filter 62 is connected to the outer IDTs 65 and 67 of the vertically connected double mode SAW resonator filter 61, the second one-port SAW resonator filter 63 is connected in series with the central IDT 66 and then after that the third one-port SAW resonator filter 64 is connected in parallel with the double mode SAW resonator filter 61 as a parallel resonator. The insertion loss—frequency characteristic of this surface acoustic wave device as a whole is shown in FIG. 16.

Comparing the characteristic shown in FIG. 16 with the characteristic shown in FIG. 14 it can be seen that with this preferred embodiment in addition to the amount of attenuation in the low-frequency side of the blocking region increasing, the amount of attenuation in the central vicinity of the blocking region also increases.

That is, in the surface acoustic wave device of this preferred embodiment, because the first one-port SAW resonator filter 62 is connected in parallel with the SAW resonator filter 61, it is possible to increase the amount of attenuation outside the pass band on the low-frequency side thereof. Also, because the second one-port SAW resonator filter 63 is connected in series and the third one-port SAW resonator filter 64 is further connected in parallel on the output side, it is possible to further increase the amount of attenuation in the blocking region without losing power-resistance or reflection coefficient of the input side terminal in the blocking region.

By means of the impedance—frequency characteristic of the third one-port SAW resonator filter 64 connected to the output terminal 70, it is also possible to make the VSWR at the output side terminal of the surface acoustic wave device of this preferred embodiment small.

In the surface acoustic wave devices of the second and third preferred embodiments also it is possible to employ the preferable modifications of the surface acoustic wave devices of the first preferred embodiment and thereby obtain the same effects as with those preferable modifications described above.

In a surface acoustic wave device according to a principle of the invention, because the first one-port SAW resonator filter is connected in parallel with the vertically connected double mode SAW resonator filter and the connection point between the two is made the input terminal, it is possible to raise the power-resistance of the device by increasing the electrode area on the input side. In addition, because the resonance frequency of the first one-port SAW resonator filter is set as described above, it is possible to increase the amount of attenuation outside the pass band on the low-frequency side thereof, i.e. in the high-frequency side of the blocking region. Therefore, when a surface acoustic wave device of the invention is used, for example, as a reception filter of an antenna of a portable telephone or the like, it is possible to increase the reflection coefficient in the blocking region and thereby it is possible to suppress losses in the pass band of the incoming side, i.e. transmission side filter.

Also, in this invention, by making the sum of the numbers of electrode fingers of the outer IDTs greater than the number of electrode fingers of the central IDT of the vertically connected double mode SAW resonator filter and connecting the first one-port SAW resonator filter to the outer pair of IDTs of the vertically connected double mode SAW resonator filter, it is possible to further increase the electrode area of the input side and thereby it is possible to more greatly improve the power-resistance of the device.

Furthermore, by making the first one-port SAW resonator filter wherein four or two SAW resonators are connected in series and making the ratio $w/\lambda_1$ of the width w of the electrode fingers to the wavelength $\lambda_1$ of the SAW resonators $w/\lambda_1 < \frac{1}{4}$, it is possible to suppress the spurious response inside the pass band and it is possible to more greatly improve the power-resistance without having an effect on the characteristics in the pass band.

Also, when the first one-port SAW resonator filter is made such that four or two resonators are connected in series and also the ratio of the spacing t between the electrode fingers of the resonators to the wavelength $\lambda_1$ of the resonators is made $t/\lambda_1 > 3$, although a spurious response existing between the resonance frequency and the antiresonance frequency of the first one-port SAW resonator filter comprising IDTs connected in series in multiple stages occurs, in this case, because $t/\lambda_1$ has been made greater than 3, in-band ripples in the pass band can be made small.

Also, if the spacing between the centers of the outer end electrode fingers of the outer IDTs and the inner end electrodes of the reflectors of the vertically connected double mode SAW resonator filter is I, when the ratio between I and the wavelength $\lambda_2$ of the reflectors is made greater than 0.53 and less than 0.59 it is possible to make the reflection coefficient in the blocking region large. Therefore, for example, when a surface acoustic wave device of the invention is used as a receiving filter of an antenna for a portable telephone, it is possible to suppress deterioration of losses inside the pass band of the filter of the incoming side, i.e. the transmission side.

Furthermore, with a construction wherein the second one-port SAW resonator filter is connected in series with the double mode SAW resonator filter, it is possible to further increase the amount of attenuation in the blocking region without losing power-resistance and reflection coefficient of the input side terminal in the blocking region.

Moreover, when a third one-port SAW resonator filter is connected in parallel with the central IDTs of the vertically connected double mode SAW resonator filter, it is possible to more greatly increase the amount of attenuation in the blocking region without losing power-resistance and reflection coefficient of the input side terminal in the blocking region and also it is possible to reduce the VSWR inside the pass band at the output side terminal.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:

the first one-port SAW resonator filter has inter digital transducers each having a plurality of pairs of mutually intermeshing electrode fingers and does not have reflectors;

the first one-port SAW resonator filter has a resonance frequency outside the pass band of the vertically connected double mode SAW resonator filter on a low-frequency side of the pass band; and a connection point between the vertically connected double mode SAW resonator filter and the first one-port SAW resonator filter comprises an input terminal; and further wherein:

the first one-port SAW resonator filter is made using a 36° Y-cut, X-propagation piezoelectric substrate and is made by connecting four or two SAW resonators in series and a ratio of a width w of the electrode fingers of the inter digital transducers comprising the SAW resonators to a wavelength $\lambda_1$ of the SAW resonators is $w/\lambda_1 < \frac{1}{4}$.

2. A surface acoustic wave device according to claim 1 wherein:

the three-electrode vertically connected double mode SAW resonator filter is made using a 36° Y-cut, X-propagation piezoelectric substrate and a spacing between centers of outer end electrode fingers of the outer inter digital transducers and centers of inner end electrodes of the reflectors is I, a ratio between I and a wavelength $\lambda_2$ of the reflectors being $0.53 \leq I/\lambda_2 \leq 0.59$.

3. A surface acoustic wave device according to claim 1, wherein:

a second one-port SAW resonator filter having an antiresonance frequency outside the pass band of the vertically connected double mode SAW resonator filter on the low-frequency side of the pass band and having no reflectors is connected to the central inter digital transducer of the three-electrode type vertically connected double mode SAW resonator filter.

4. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:

the first one-port SAW resonator filter has inter digital transducers each having a plurality of pairs of mutually intermeshing electrode fingers and does not have reflectors;

the first one-port SAW resonator filter has a resonance frequency outside the pass band of the vertically connected double mode SAW resonator filter on a low-frequency side of the pass band; and a connection point between the vertically connected double mode SAW resonator filter and the first one-port SAW resonator filter comprises an input terminal;

the vertically connected double mode SAW resonator filter comprises a three-electrode type vertically connected double mode SAW resonator filter having three inter digital transducers disposed along a surface wave propagation direction, two of the transducers comprising outer transducers disposed about a central transducer;

a sum of the numbers of electrode finger s of the outer inter digital transducers being greater than the number of electrode fingers of the central inter digital transducer; and the first one-port SAW resonator filter being connected to the pair of outer inter digital transducers of the three-electrode type vertically connected double mode SAW resonator filter; and further wherein:

the first one-port SAW resonator filter is made using a 36° Y-cut, X-propagation piezoelectric substrate and is made by connecting four or two SAW resonators in series and a ratio of a width w of the electrode fingers of the inter digital transducers comprising the SAW resonators to a wavelength $\lambda_1$ of the SAW resonators is $w/\lambda_1 < \frac{1}{4}$.

5. A surface acoustic wave device according to claim 4 wherein:

the three-electrode vertically connected double mode SAW resonator filter is made using a 36° Y-cut, X-propagation piezoelectric substrate and a spacing between centers of outer end electrode fingers of the outer inter digital transducers and centers of inner end electrodes of the reflectors is I, a ratio between I and a wavelength $\lambda_2$ of the reflectors being $0.53 \leq I/\lambda_2 \leq 0.59$.

6. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:

the first one-port SAW resonator filter has inter digital transducers each having a plurality of pairs of mutually intermeshing electrode fingers and does not have reflectors;

the first one-port SAW resonator filter has a resonance frequency outside the pass band of the vertically connected double mode SAW resonator filter on a low-frequency side of the pass band; and a connection point between the vertically connected double mode SAW resonator filter and the first one-port SAW resonator filter comprises an input terminal;

the vertically connected double mode SAW resonator filter comprises a three-electrode type vertically connected double mode SAW resonator filter having three inter digital transducers disposed along a surface wave propagation direction, two of the transducers comprising outer transducers disposed about a central transducer;

a sum of the numbers of electrode fingers of the outer inter digital transducers being greater than the number of electrode fingers of the central inter digital transducer; and the first one-port SAW resonator filter being connected to the pair of outer inter digital transducers of the three-electrode type vertically connected double mode SAW resonator filter; and further wherein:

the first one-port SAW resonator filter is made using a 36° Y-cut, X-propagation piezoelectric substrate and is made by connecting four or two resonators in series, and a ratio of a spacing t between the electrode fingers of the inter digital transducers of adjacent resonators to a wavelength $\lambda_1$ of the resonators is $t/\lambda_1 > 3$.

7. A surface acoustic wave device according to claim 6 wherein:

the three-electrode vertically connected double mode SAW resonator filter is made using a 36° Y-cut, X-propagation piezoelectric substrate and a spacing between centers of outer end electrode fingers of the outer inter digital transducers and centers of inner end electrodes of the reflectors is I, a ratio between I and a wavelength $\lambda_2$ of the reflectors being $0.53 \leq I/\lambda_2 \leq 0.59$.

8. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:

the first one-port SAW resonator filter has inter digital transducers each having a plurality of pairs of mutually intermeshing electrode fingers and does not have reflectors;

the first one-port SAW resonator filter has a resonance frequency outside the pass band of the vertically connected double mode SAW resonator filter on a low-frequency side of the pass band; and a connection point between the vertically connected double mode SAW resonator filter and the first one-port SAW resonator filter comprises an input terminal;

the vertically connected double mode SAW resonator filter comprises a three-electrode type vertically connected double mode SAW resonator filter having three inter digital transducers disposed along a surface wave propagation direction, two of the transducers comprising outer transducers disposed about a central transducer;

a sum of the numbers of electrode fingers of the outer inter digital transducers being greater than the number of electrode fingers of the central inter digital transducer; and the first one-port SAW resonator filter being connected to the pair of outer inter digital transducers of the three-electrode type vertically connected double mode SAW resonator filter; and further wherein:

the three-electrode vertically connected double mode SAW resonator filter is made using a 36° Y-cut, X-propagation piezoelectric substrate and a spacing between centers of outer end electrode fingers of the outer inter digital transducers and centers of inner end electrodes of the reflectors is I, a ratio between I and a wavelength $\lambda_2$ Of the reflectors being $0.53 \leq I/\lambda_2 \leq 0.59$.

9. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:

the first one-port SAW resonator filter has inter digital transducers each having a plurality of pairs of mutually intermeshing electrode fingers and does not have reflectors;

the first one-port SAW resonator filter has a resonance frequency outside the pass band of the vertically connected double mode SAW resonator filter on a low-frequency side of the pass band; and a connection point between the vertically connected double mode SAW resonator filter and the first one-port SAW resonator filter comprises an input terminal; and further wherein:
the first one-port SAW resonator filter is made using a 36° Y-cut, X-propagation piezoelectric substrate and is made by connecting four or two resonators in series, and
a ratio of a spacing t between the electrode fingers of the inter digital transducers of adjacent resonators to a wavelength $\lambda_1$ of the resonators is $t/\lambda_1 > 3$.

10. A surface acoustic wave device according to claim 9, wherein:
a second one-port SAW resonator filter having an antiresonance frequency outside the pass band of the vertically connected double mode SAW resonator filter on the low-frequency side of the pass band and having no reflectors is connected to the central inter digital transducer of the three-electrode type vertically connected double mode SAW resonator filter.

11. A surface acoustic wave device according to claim 8 wherein:
the three-electrode vertically connected double mode SAW resonator filter is made using a 36° Y-cut, X-propagation piezoelectric substrate and a spacing between centers of outer end electrode fingers of the outer inter digital transducers and centers of inner end electrodes of the reflectors is I, a ratio between I and a wavelength $\lambda_2$ of the reflectors being $0.53 \leq I/\lambda_2 \leq 0.59$.

12. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:
the first one-port SAW resonator filter has inter digital transducers each having a plurality of pairs of mutually intermeshing electrode fingers and does not have reflectors;
the first one-port SAW resonator filter has a resonance frequency outside the pass band of the vertically connected double mode SAW resonator filter on a low-frequency side of the pass band; and
a connection point between the vertically connected double mode SAW resonator filter and the first one-port SAW resonator filter comprises an input terminal; and further wherein:
the three-electrode vertically connected double mode SAW resonator filter is made using a 36° Y-cut, X-propagation piezoelectric substrate and a spacing between centers of outer end electrode fingers of the outer inter digital transducers and centers of inner end electrodes of the reflectors is I, a ratio between I and a wavelength $\lambda_2$ of the reflectors being $0.53 \leq I/\lambda_2 \leq 0.59$.

13. A surface acoustic wave device according to claim 12, wherein:
a second one-port SAW resonator filter having an antiresonance frequency outside the pass band of the vertically connected double mode SAW resonator filter on the low-frequency side of the pass band and having no reflectors is connected to the central inter digital transducer of the three-electrode type vertically connected double mode SAW resonator filter.

14. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:

the first one-port SAW resonator filter has inter digital transducers each having a plurality of pairs of mutually intermeshing electrode fingers and does not have reflectors;
the first one-port SAW resonator filter has a resonance frequency outside the pass band of the vertically connected double mode SAW resonator filter on a low-frequency side of the pass band; and
a connection point between the vertically connected double mode SAW resonator filter and the first one-port SAW resonator filter comprises an input terminal;
the vertically connected double mode SAW resonator filter comprises a three-electrode type vertically connected double mode SAW resonator filter having three inter digital transducers disposed along a surface wave propagation direction, two of the transducers comprising outer transducers disposed about a central transducer;
a sum of the numbers of electrode fingers of the outer inter digital transducers being greater than the number of electrode fingers of the central inter digital transducer; and
the first one-port SAW resonator filter being connected to the pair of outer inter digital transducers of the three-electrode type vertically connected double mode SAW resonator filter; and further wherein:
a second one-port SAW resonator filter having an antiresonance frequency outside the pass band of the vertically connected double mode SAW resonator filter on the low-frequency side of the pass band and having no reflectors is connected to the central inter digital transducer of the three-electrode type vertically connected double mode SAW resonator filter.

15. A surface acoustic wave device comprising a first one-port SAW resonator filter electrically connected in parallel with a three-electrode vertically connected double mode SAW resonator filter having reflectors, the vertically connected double mode SAW resonator filter having a pass band, and wherein:
the first one-port SAW resonator filter has inter digital transducers each having a plurality of pairs of mutually intermeshing electrode fingers and does not have reflectors;
the first one-port SAW resonator filter has a resonance frequency outside the sass band of the vertically connected double mode SAW resonator filter on a low-frequency side of the pass band; and
a connection point between the vertically connected double mode SAW resonator filter and the first one-port SAW resonator filter comprises an input terminal; and further wherein:
a second one-port SAW resonator filter having an antiresonance frequency outside the pass band of the vertically connected double mode SAW resonator filter on the low-frequency side of the pass band and having no reflectors is connected to the central inter digital transducer of the three-electrode type vertically connected double mode SAW resonator filter.

16. A surface acoustic wave device according to claim 15 wherein:
a third one-port SAW resonator filter having a resonance frequency outside the pass band of the vertically connected double mode SAW resonator filter on the low-frequency side of the pass band and having no reflectors is connected to the central inter digital transducer of the three-electrode type vertically connected double mode SAW resonator filter.

* * * * *